United States Patent [19]

Sparks

[11] Patent Number: 4,943,961
[45] Date of Patent: Jul. 24, 1990

[54] MEMORY RETENTION SYSTEM FOR VOLATILE MEMORY DEVICES

[75] Inventor: Bradley A. Sparks, Indianapolis, Ind.

[73] Assignee: RCA Licensing Corporation, Princeton, N.J.

[21] Appl. No.: 190,437

[22] Filed: May 5, 1988

[51] Int. Cl.⁵ .............................................. G11C 13/00
[52] U.S. Cl. ....................................... 365/228; 365/226
[58] Field of Search ............... 365/226, 227, 228, 148, 365/149, 175, 182, 183; 371/14, 7; 307/296

[56] References Cited

U.S. PATENT DOCUMENTS

| | | | |
|---|---|---|---|
| 4,143,286 | 3/1979 | Koike et al. | 365/228 |
| 4,475,180 | 10/1984 | Sekiya et al. | 365/228 |
| 4,534,018 | 8/1985 | Eckert | 365/228 |
| 4,638,464 | 1/1987 | Cranford, Jr. et al. | 365/226 |
| 4,672,585 | 6/1987 | Nollet | 365/226 |
| 4,673,829 | 6/1987 | Gupta | 365/226 |
| 4,689,495 | 8/1987 | Liu | 365/228 |
| 4,752,699 | 6/1988 | Cranford, Jr. et al. | 365/226 |
| 4,800,528 | 1/1989 | Geddes | 365/185 |

*Primary Examiner*—Terrell W. Fears
*Attorney, Agent, or Firm*—Joseph S. Tripoli; Peter M. Emanuel; Thomas F. Lenihan

[57] ABSTRACT

A memory retention system for an electronic apparatus having several logic devices driven by a common oscillator includes a capacitor for retaining a voltage on at least one of the logic devices and means for stopping the oscillator during a power failure. The logic devices have respective oscillator input terminals which are connected together and to the input terminal of the oscillator rather than to the output terminal of the oscillator to reduce current drain from the capacitor.

11 Claims, 1 Drawing Sheet

MEMORY RETENTION SYSTEM FOR VOLATILE MEMORY DEVICES

BACKGROUND

This invention relates generally to memory retention systems for electronic devices having volatile memory, and particularly to such systems for electronic equipment having at least two logic devices clocked by a common oscillator.

Many types of electronic equipment include logic devices, such as microprocessors, microcomputers and custom logic integrated circuits, which are used to store data and to perform various control functions of the equipment. Frequently, in an effort to minimize the production cost, the logic devices are clocked by a common oscillator. The storage mechanism of many logic devices is volatile memory. As is known to those skilled in the art, when an electronic apparatus which includes volatile memory logic devices is de-energized the data stored in the logic devices are completely lost. For this reason, it is preferable that such equipment include a means for maintaining a biasing voltage on the logic devices so that a failure of, or a significant decrease in, the biasing voltages does not result in a rapid memory loss by the various logic devices.

An example of equipment which includes several logic devices, at least one of which has a volatile memory, is a television receiver which can be remotely controlled by a handheld, infrared (IR) remote control unit. Such television receivers typically include custom logic integrated circuitry (IC) which decodes and holds the commands received from the remote control unit. Such receivers also typically include a microprocessor or microcomputer, typically a random access memory (RAM), to store data received from the custom logic IC and also to make any data manipulations needed by the custom IC to effect the various operating functions of the receiver. Typically, at least one, and frequently both, of the logic devices includes a volatile memory and therefore are subject to memory loss in the event of the failure of the biasing voltages to the logic devices. It should be understood that the loss of the biasing voltages to the logic devices does not occur when the receiver is turned off. The biasing voltage losses occur when the television receiver is unplugged from the AC voltage source, or in the event of a failure of the AC supply lines.

The custom logic integrated circuit includes an eight bit register which stores the control information received from the remote control unit. For example, assume that the television viewer wishes to change the volume of the receiver. The viewer pushes the volume key on the handheld remote control unit. This results in the IC receiving a data stream which is indicative of the desired volume change. The IC decodes and stores the desired command as an eight bit value. The microprocessor periodically queries the IC to determine whether or not a command has been received from the hand held unit. The desired volume change is noted by the microprocessor which makes any data manipulations needed to effect the change and inputs the newly manipulated data into the custom IC to effect the change. The microprocessor also stores the data which were input to the analog interface unit AIU. Any delay between the reception of the change from the remote control unit and the execution of the command is in the order of a few milliseconds and the operator does not notice any undesirable delay.

When a receiver of the type mentioned above is initially installed in the viewer's home, the receiver is energized by the standard 110V AC power available in the viewer's home. The viewer is provided with an instruction book which contains instructions on how to program the tuner to scan the local channels or those which are available on cable. The viewer is also instructed on how to program other functions, such as setting a clock which is included in the receiver, into the IC memory. When the logic devices are volatile memory devices, a momentary loss of power to the receiver results in the loss of all the stored data and the viewer must completely reprogram the receiver. In the prior art, memory retention has been accomplished by placing a capacitor at the biasing terminal of the logic device to retain a voltage on the memory for a period of time following power loss.

The logic devices require a clocking oscillator and in order to minimize the manufacturing cost of the receiver, it is a common practice to utilize the same oscillator for all the logic devices within the receiver. However, during power loss the oscillator will be energized by a voltage developed across the capacitor intended to retain the biasing voltage on the memory, thereby quickly depleting the charge on the capacitor and substantially decreasing the time available for memory retention. For these reasons there is a need for a system for preventing the loss of the data stored in volatile memory logic devices within electronic equipment during periods in which the supply voltage drops below an acceptable level, and also for turning off the clocking oscillator during such low voltage periods. The present invention fulfills these needs.

SUMMARY

A memory retention system for an electronic apparatus having at least two logic devices driven by a common oscillator includes means for retaining a voltage on at least one of the logic devices and means for stopping the oscillator during power failure.

DETAILED DESCRIPTION

Figure 1:
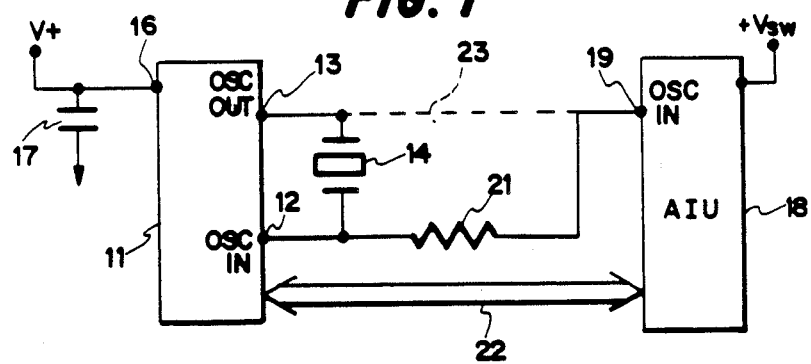
FIG. 1 is a block diagram of the simplest and least expensive preferred embodiment of the invention.

In FIG. 1, a microprocessor 11, or microcomputer which terms are used interchangeably herein, includes an oscillator input (OSC IN) terminal 12 and an oscillator (OSC OUT) terminal 13. An oscillator frequency determining crystal 14 is arranged across the terminals 12 and 13 for forming an oscillator in conjunction with internal elements of unit 11. The oscillator supplies clocking pulses for use by circuits within microprocessor 11. A V+ biasing source is coupled to a biasing terminal 16 of the microprocessor 11. A charge storage device 17, preferably a capacitor, is arranged between the biasing terminal 16 and ground. The microprocessor 11 preferably is a Motorola model number 68H605 microprocessor.

An analog interface unit (AIU) 18 is a custom logic integrated circuit, preferably a RCA model number 1421874-2 integrated circuit, and is voltage biased by a $+V_{SW}$ voltage. The AIU 18 includes an oscillator input (OSC IN) terminal 19. The terminal 19 is connected to the same side of the oscillator 14 as is the OSC IN terminal 12 of the microprocessor 11 by a current limiting resistor 21. A bilateral data bus 22 is arranged between the microprocessor 11 and the AIU 18. This bilateral bus permits communication between the two logic devices 11 and 18 to enable the microprocessor 11 to query the status of the AIU 18 and to provide manipulated data to the AIU 18.

The oscillator terminals 12 and 19 of the microprocessor 11 and the AIU 18 respectively exhibit a high impedance when the super biasing voltages are present on the devices. When the biasing voltage falls below an acceptable level, or disappears, the terminals 12 and 19 exhibit low impedance. During the low voltage condition, the terminal 19 of the AIU 18 exhibits a low impedance in response to the $+V_{SW}$ voltage going low. The OSC IN terminal 12 is loaded by the low impedance at terminal 19 and is caused to stop. Accordingly, substantially all the charge available on the capacitor 17 is used to retain the memory of the microprocessor 11, since with the oscillator disabled very little or no charge a capacitor 17 is lost due to oscillator operation. The voltage on the capacitor 17 can be retained for half an hour or more, depending upon the capacitance of the capacitor 17 and the internal impedance of the microprocessor 11, and the selection of the capacitor for this purpose is within the purview of one skilled in the art. When the AIU 18 is a volatile memory device the loss of biasing voltage causes the loss of the data in the memory of the device. However, because all data in the AIU 18 are provided by the microprocessor 11 and are stored by the microprocessor 11, the stored data are not permanently lost. When the proper biasing voltages are restored to the system, the conditions which existed in the AIU 18 prior to the power failure are restored to the AIU by the microprocessor 11 over the data bus 22.

The advantages of the embodiment of FIG. 1 over the prior art can be appreciated by reconnecting the circuit of FIG. 1 in the prior art manner. In the prior art the oscillator terminal 13 of the microprocessor 11 is connected to the OSC IN terminal 19 of the AIU 18, as indicated by the phantom line 23. Also, resistor 21 and the line connecting it to terminal 19 are eliminated. With this connection a low impedance path exists from AIU terminal 19 to capacitor 17 when the biasing voltages fall below the acceptable level and $+V_{SW}$ turns off. Accordingly, the capacitor 17 is quickly discharged by the low impedance path, thereby substantially decreasing the time that the capacitor can assist in retaining the data in the volatile memory of the microprocessor 11. One prior art attempt at improving the charge retention time of the capacitor 17 utilizing the prior art connection 23 included placing a small blocking capacitor in the line 23 to avoid a low input impedance from the terminal 13 of microprocessor 11 to the AIU terminal 19. However, high frequency transients from electrostatic discharges are free to traverse the series path, and the microprocessor 11 is subject to failure because of such transients.

Figure 2:
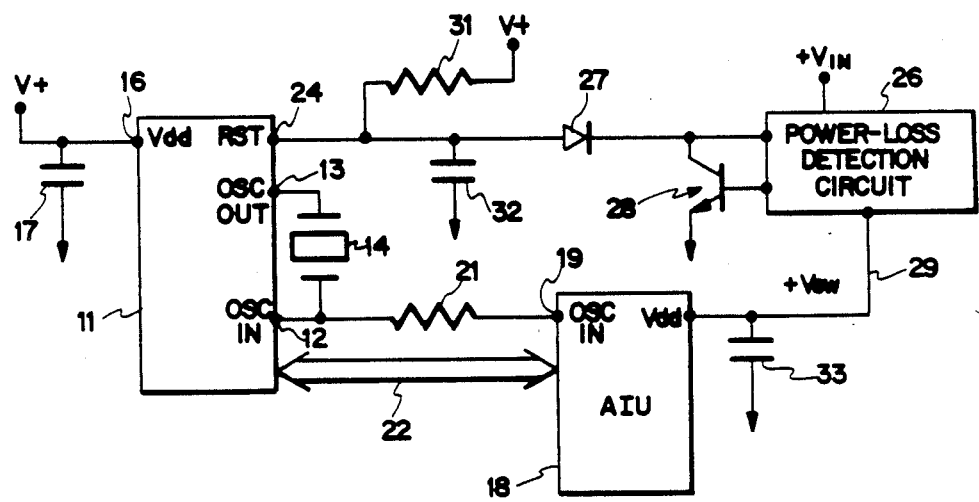
FIG. 2 is a second preferred embodiment of the invention.

FIG. 2 is another preferred embodiment of the present invention. In the FIG. 2 embodiment, parts which are similar to those of FIG. 1 are so indicated by like reference numbers. The microprocessor 11 includes a reset terminal (RST) 24 which is coupled to a power loss detection circuit 26 by a diode 27. A voltage responsive switch, preferably a transistor 28, is arranged between the diode 27, the power loss detection circuit 26, and ground. The diode 27 isolates the RST terminal 24 from the power loss detection circuit 26 when the transistor 28 is turned off. The AIU 18 receives a biasing voltage $+V_{SW}$ at terminal $V_{dd}$ from the power loss detection circuit 26 by a line 29.

A resistor 31 and capacitor 32 are coupled to the RST terminal 24 of the microprocessor 11. The resistor 31 and capacitor 32 cause the reset voltage to lag behind the V+ voltage when power is reapplied, thereby allowing the oscillator 14 to start running shortly before the microprocessor 11 begins operation after being reset. A capacitor 33 is connected between the biasing line 29 and ground. Capacitor 33 is needed because of the exemplary microprocessor 11 chosen for the preferred embodiment. This microprocessor requires six oscillator cycles after the reset pin goes low to complete the reset function. Stopping the oscillator at the same time the reset line goes low would not produce an adequate reset. Accordingly, the capacitor 33 is used to slightly delay the stopping of the oscillator to allow the required six clock cycles to occur and complete the reset function.

In operation, when the proper biasing voltages are present to both the microprocessor 11 and the power loss detection circuit 26, the transistor 28 is non-conductive and the line 29 is high to apply the biasing voltage $+V_{SW}$ to the AIU 18. When the power loss detection circuit 26 detects the loss of the biasing voltage $V_{in}$, the transistor 28 becomes conductive to pull the RST terminal 24 of the microprocessor 11 low and also to discontinue the $+V_{SW}$ biasing voltage to the AIU 18. OSC IN terminal 12 of unit 11 is loaded when the terminal 19 of the AIU 18 becomes low impedance upon the discharge of the capacitor 33 and causes the oscillator of unit 11 to stop. The charge on the capacitor 17 is then available for the sole purpose of retaining the data stored in the volatile memory of the microprocessor 11.. When the biasing voltages are restored to the system, the transistor 28 turns off and the $+V_{SW}$ voltage to the AIU 18 is restored. Upon restoration of the input voltages $V_{in}$, the terminal 19 of the AIU chip 18 returns to a high impedance state and the oscillator of unit 11 begins operating.

What is claimed is:

1. An electronic apparatus including at least two logic devices driven by a common oscillator comprising:
    memory means contained within a first one of said logic devices;
    means for retaining a voltage on at least said first one of said logic devices during power reductions; and
    means coupled to said oscillator for stopping said oscillator during power reductions in response to said control signal;
    said oscillator having an input terminal and an output terminal, said logic devices having respective oscillator input terminals coupled together and to said input terminal of said oscillator for receiving an oscillator signal from the input terminal of said oscillator.

2. The apparatus of claim 1 further including power loss detection means for biasing at least one of said logic devices.

3. A memory retention system for an electronic apparatus including first and second logic devices clocked by a common oscillator integrally associated with one of said logic devices, each of said logic devices including an oscillator input terminal having a high impedance when said logic devices receive a biasing voltage and a low impedance when said biasing voltage falls below an acceptable level, at least one of said logic devices including a memory, the memory of said first logic device being volatile whereby stored data is lost when said biasing voltage falls below said acceptable level, said memory retention system including:

charge storage means responsive to said biasing voltage and associated with said first logic device which includes said volatile memory, for retaining a voltage on said volatile memory for a preselected time after said biasing voltage falls below said acceptable level; and means for coupling together said oscillator input terminals of said logic devices, said oscillator being stopped by said oscillator input terminal of said second logic device exhibiting said low impedance when said biasing voltage falls below said acceptable level.

4. The system of claim 3 wherein said means for coupling is a resistor.

5. The system of claim 3 wherein said charge storage means is a capacitor.

6. The system of claim 3 wherein said oscillator is associated with said first logic device and said first logic device includes a reset terminal, and further including power-loss detection means for biasing said second logic device, and switch means responsive to said power loss detection means and coupled to said reset terminal.

7. The system of claim 6 wherein said switch means is a transistor.

8. The system of claim 7 wherein said second logic device is arranged between said oscillator input of said first logic device and said power loss detection means.

9. The system of claim 3 further including power-loss detection means for biasing said second logic device, and switch means responsive to said power loss detection means and coupled to a reset terminal of said first logic device.

10. The system of claim 9 wherein said switch means is a transistor.

11. The system of claim 10 wherein said second logic device is arranged between said oscillator input of said first logic device and said power loss detection means.

* * * * *